US006333669B1

(12) United States Patent
Kobayashi et al.

(10) Patent No.: US 6,333,669 B1
(45) **Date of Patent: *Dec. 25, 2001**

(54) VOLTAGE CONVERTING CIRCUIT ALLOWING CONTROL OF CURRENT DRIVABILITY IN ACCORDANCE WITH OPERATIONAL FREQUENCY

(75) Inventors: Mako Kobayashi; Fukashi Morishita, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/191,122

(22) Filed: Nov. 13, 1998

(30) Foreign Application Priority Data

May 29, 1998 (JP) .......... 10-148899

(51) Int. Cl.[7] .......... G01R 23/06
(52) U.S. Cl. .......... 327/541; 327/102
(58) Field of Search .......... 327/102, 108, 327/540, 541, 542, 543, 47; 365/226, 227, 229

(56) References Cited

U.S. PATENT DOCUMENTS 5,295,112 * 3/1994 Taniguchi .......... 365/227
5,315,166 * 5/1994 Arimoto .......... 327/537
5,689,460 * 11/1997 Ooishi .......... 327/535
5,736,879 * 4/1998 Pham .......... 327/102
5,903,513 * 5/1999 Itou .......... 365/189.11
5,986,959 * 11/1999 Itou .......... 365/226
6,058,061 * 5/2000 Ooishi .......... 365/226

FOREIGN PATENT DOCUMENTS 8-339682 12/1996 (JP) .......... G11C/11/401

OTHER PUBLICATIONS

Ultra LSI Memory, K. Ito, Advanced Electronic Series, BAIFUKAN, Nov. 5, 1995, pp. 307–310.

* cited by examiner

*Primary Examiner*—Timothy P. Callahan
*Assistant Examiner*—Terry L. Englund
(74) *Attorney, Agent, or Firm*—McDermott, Will & Emery

(57) ABSTRACT

The voltage converting circuit 10 includes a standby VDC, an active VDC which operates when the semiconductor integrated circuit device is activated and has current drivability larger than that of standby VDC, and a drivability control circuit. Drivability control circuit generates a control signal in accordance with operational frequency of the semiconductor integrated circuit device. Current drivability of the active the VDC is controlled in accordance with the operational frequency by the control signal.

16 Claims, 6 Drawing Sheets

VOLTAGE CONVERTING CIRCUIT ALLOWING CONTROL OF CURRENT DRIVABILITY IN ACCORDANCE WITH OPERATIONAL FREQUENCY

BACKGROUND OF THE INVENTION

1. Field of the Invention

The present invention relates to a semiconductor integrated circuit device including a voltage converting circuit or a voltage down converter (VDC) receiving an externally supplied external power supply voltage and converting the voltage to an internal power supply voltage lower than the external power supply voltage, and, more particularly, to a structure of a voltage converting circuit which allows control of current drivability in accordance with operational frequency.

2. Description of the Background Art

Recently, operational voltage for LSI memories has been made lower and lower. Especially, it has been strongly demanded that transistors in semiconductor integrated circuit devices such as represented by LSI memories operate at a voltage lower than the externally applied power supply voltage. The operational voltage is made lower mainly to reduce power consumption of the LSI memory and to ensure reliability of the transistors which are made smaller and smaller.

In a DRAM (Dynamic Random Access Memory) in particular, lowering of the operational voltage is of critical importance to ensure reliability of capacitor dielectric film, serving as a charge storage portion in the memory cell.

Under the circumstances, upper limit of the power supply voltage for driving internal elements of semiconductor integrated circuit devices has been made lower with respect to an external power supply voltage used in the overall system, generation by generation of development.

In order to meet the demand, a voltage converting circuit receiving an external power supply voltage supplied from an external power supply for generating a stable internal power supply voltage in the semiconductor integrated circuit device has been provided.

FIG. 11 is a schematic block diagram showing a general structure of a conventional voltage converting circuit.

Referring to FIG. 11, voltage converting circuit 10 receives an external power supply voltage (hereinafter referred to as Ext. Vcc) from an external power supply line 70, and outputs a converted internal power supply voltage (hereinafter refer to as Int. Vcc) to an internal power supply line 80. Internal power supply line 80 supplies Int. Vcc to peripheral circuitry 21, an array control circuit 22 and so on.

Voltage converting circuit 10 includes a reference voltage generating unit 11 for generating a reference voltage (hereinafter referred to as Vref) As a reference value for the level of Int. Vcc and a voltage lowering unit 12 for converting Ext. Vcc to Int. Vcc based on Vref.

FIG. 12 is a circuit diagram of voltage converting circuit 2000 of a conventional structure including a plurality of voltage lowering units.

Referring to FIG. 12, voltage converting circuit 2000 includes, as the voltage lowering unit 12, an active voltage down converter 400 (hereinafter referred to as active VDC) and a standby voltage down converter 410 (hereinafter referred to as standby VDC). Further, the voltage converting circuit 2000 includes a voltage dividing circuit 420 for dividing the voltage Int. Vcc and feeding a voltage Vi' back to the active VDC 400 and the standby VDC 410. Further, an internal power supply line 440 supplies load current to internal circuits (not shown).

The operation of active VDC 400 will be described.

Active VDC 400 includes transistors 401 to 404 constituting a current mirror type differential amplifier 405, a current control transistor 406 controlling driving current for transistors 401 to 404, and a P type driver transistor 407 connected between an external power supply line 430 and internal power supply line 440.

Differential amplifier 405 receives Vref at the gate of transistor 401, receives the voltage Vi' which is the voltage Int. Vcc divided by voltage dividing circuit 420 at the gate of transistor 402, amplifies a difference between Vref. and Vi', and outputs the amplified difference to the gate of driver transistor 407.

When Vi' is lower than Vref., that is, when the voltage level of Int. Vcc is lower than a desired level, differential amplifier 405 outputs a negative voltage which corresponds to the amplified voltage difference between the two, to the gate of driver transistor 407. At this time, driver transistor 407 supplies a current which corresponds to the drop of the gate voltage, from external power supply line 430 to internal power supply line 440. In this manner, the voltage Int. Vcc is recovered.

When Vi' is approximately equal to Vref., that is, when Int. Vcc is at the desired level, driver transistor 407 is rendered non-conductive by differential amplifier 405, and therefore current is not supplied to internal power supply line 440.

By the above described operation, Int. Vcc is kept at a constant desired level.

Actually, however, the series of operation of feeding back the variation of Int. Vcc, amplifying the difference by differential amplifier 405, changing the gate voltage of driver transistor 407 and supplying current to internal power supply line 440 results in a time delay.

Accordingly, the level of Int. Vcc unavoidably involves transitional fluctuation such as an undershoot or an overshoot.

In order to suppress such fluctuation, it is necessary to improve response of differential amplifier 405 and to enhance current drivability of the VDC. More specifically, it is necessary to enlarge driving current of transistors 401 to 404 constituting differential amplifier 405.

Larger driving current of the transistor, however, means increased power consumption.

Load current consumed in internal circuits differ considerably dependent on whether the semiconductor integrated circuit device is in operable state (hereinafter referred to as active state) or not (hereinafter refer to as standby state).

Accordingly, in the active state where load current is large, VDC must have high current drivability to stabilize Int. Vcc, whereas in the standby state where Int. Vcc is less susceptible to fluctuation, VDC may have only a small current drivability.

In view of the foregoing, standby VDC 410 is required to attain both superior follow up on the fluctuation of Int. Vcc and reduced power consumption. Basic structure and operation of standby VDC 410 are the same as those of active VDC.

In standby VDC 410, current control transistor 416 operates in a linear region so as to supply a constant small current to transistors 411 to 414 constituting differential amplifier 415.

In active VDC 400, current control transistor 406 receives at its gate an activating signal ϕ which assumes "H" level when the device is activated and assumes "L" level at the time of standby, and operates in a saturation region so that it is rendered conductive only in the active state and non-conductive in the standby state.

Consequently, the active VDC operates with its current drivability enlarged only when the device is activated.

As described above, by providing a standby VDC having small current drivability and not consuming much current with a differential amplifier having small driving current, and an active VDC having large current drivability with a differential amplifier having large driving current arranged parallel to each other and by operating the active VDC only when necessary, it is possible to provide a voltage converting circuit having superior response to fluctuation of the voltage Int. Vcc in the active state.

The voltage converting circuit having such a structure is described, for example, in *Ultra LSI Memory*, Kiyoo Ito, BAIFUKAN, pp. 307–310, 1995.

As the speed of operation of the device has been increased, however, the problem of response of the voltage converting circuit comes to have higher importance.

In the semiconductor integrated circuit device, every time an external clock signal in accordance with an operational frequency is applied, operation such as data writing or reading takes place, and therefore load current in the active state changes with operational frequency.

With ever increasing speed of operation of the device, it has become more common that the semiconductor integrated circuit device operate under wider range of operational frequency. Consider a general purpose memory, for example. A semiconductor integrated circuit device, in which a voltage converting circuit designed to meet high speed operation by the conventional technique is mounted, consumes extra current when the system into which the device is incorporated has low operational frequency.

SUMMARY OF THE INVENTION

An object of the present invention is to provide a semiconductor integrated circuit device including a voltage converting circuit having such a structure that attains both sufficient response over wide range of operational frequency and reduction in power consumption.

Briefly stated, the present invention provides a semiconductor integrated circuit device including an internal circuitry, an external power supply line, a first internal power supply line and a first voltage converting circuit.

The internal circuitry operates receiving an internal power supply voltage lower than an external power supply voltage.

The external power supply line transmits the external power supply voltage.

The first internal power supply line transmits the internal power supply voltage to the internal circuitry.

The first voltage converting circuit receives the external power supply voltage supplied from the external power supply line and converts the same to the internal power supply voltage, and supplies the internal power supply voltage to the first internal power supply line.

The first voltage converting circuit includes a reference voltage generating circuit, a first voltage down converter, a second voltage down converter and a drivability control circuit.

The reference voltage generating circuit generates a reference voltage which is a reference value for the internal power supply voltage.

The first voltage down converter supplies current with a first current drivability from the external power supply line to the first internal power supply line when the voltage of the first internal power supply line is lower than the reference voltage.

The second voltage down converter operates in response to activation of the internal circuitry and supplies current with a second current drivability higher than the first current drivability, from the external power supply line to the first internal power supply line when the voltage of the first internal power supply line is lower than the reference voltage.

The drivability control circuit controls the second current drivability in accordance with the operational frequency of the semiconductor integrated circuit device.

Therefore, an advantage of the present invention is that voltage control characteristic in accordance with the operational frequency can automatically be ensured without increasing wasteful power consumption, over wide range of operational frequency, as the current drivability of the voltage down converter is controlled in accordance with the operational frequency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
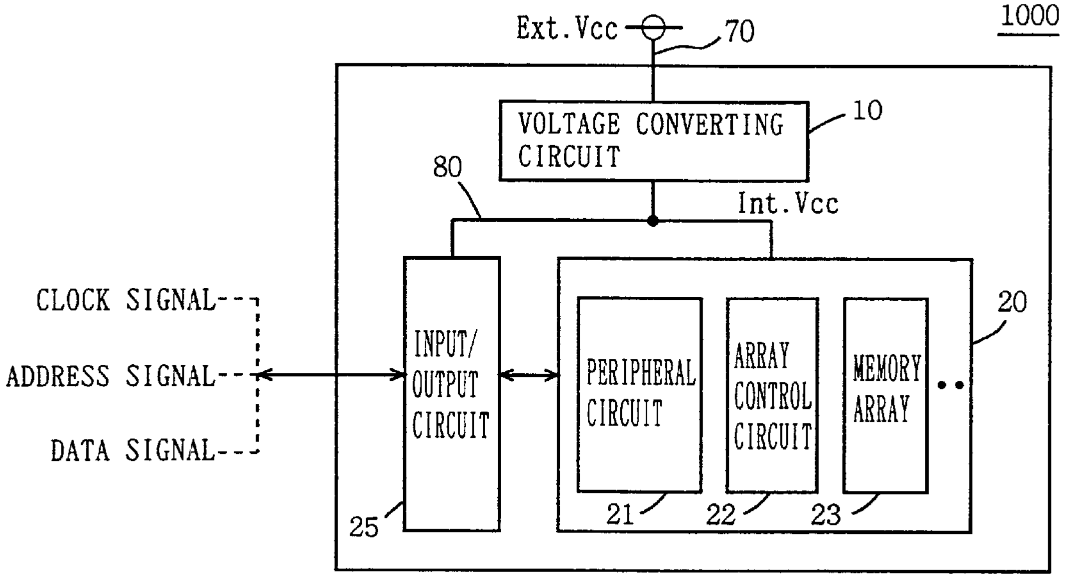
FIG. 1 is a schematic block diagram showing an overall structure of semiconductor integrated circuit device 1000 in accordance with a first embodiment of the present invention.

FIG. 1 is a schematic block diagram showing an overall structure of semiconductor integrated circuit device 1000 in accordance with the first embodiment of the present invention.

Referring to FIG. 1, semiconductor integrated circuit device 1000 includes: a voltage converting circuit 10 for converting external power supply voltage Ext. Vcc received from an external power supply line 70 to internal power supply voltage Int. Vcc; an internal circuitry 20 including a peripheral circuit 21 which operates receiving Int. Vcc from an internal power supply line 80, an array control circuit 22 and a memory array 23; and an input/output circuit 25 exchanging a clock signal, an address signal, data and so on with the outside, and exchanging these signals with internal circuitry 20.

Figure 2:
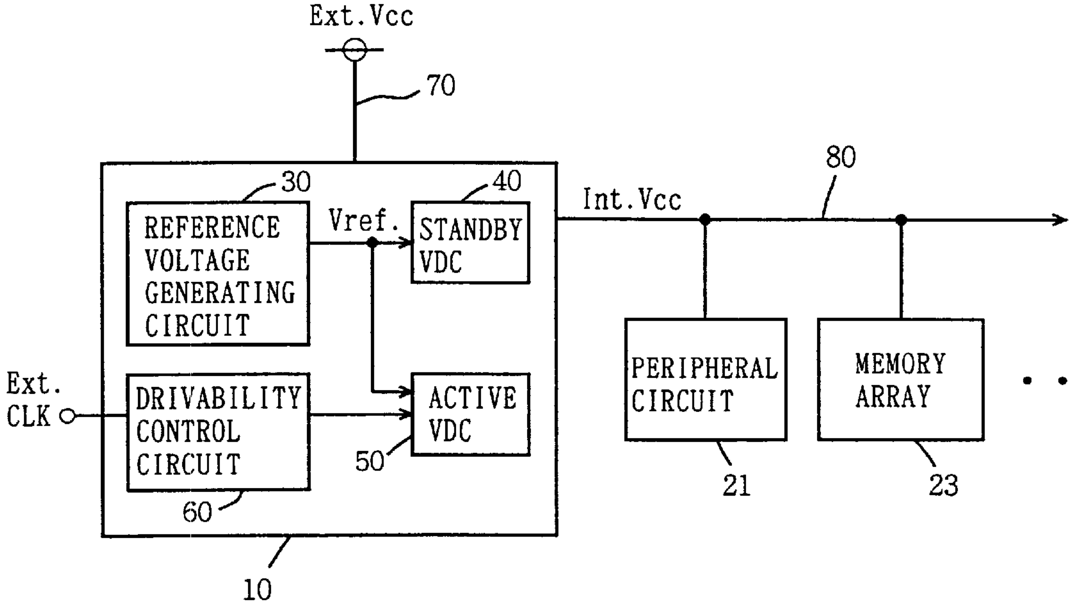
FIG. 2 is a block diagram showing in greater detail the structure of voltage converting circuit 10 of FIG. 1.

FIG. 2 is a block diagram showing, in greater detail, the structure of voltage converting circuit 10 of FIG. 1.

Referring to FIG. 2, voltage converting circuit 10 includes: a reference voltage generating circuit 30 generating Vref. which is a reference value for Int. Vcc; a voltage down converter operating in the standby state and having small current drivability (hereinafter referred to as a standby VDC) 40; a voltage down converter operating at the active state, and having large current drivability (hereinafter referred to as an active VDC) 50; and drivability control circuit 60 receiving an external clock signal and generating a control signal for adjusting current drivability of active VDC 50 in accordance with operational frequency.

Voltage converting circuit 10 receives Ext. Vcc from external power supply line 70, converts the same to Int. Vcc and supplies the converted voltage to internal power supply line 80.

Figure 3:
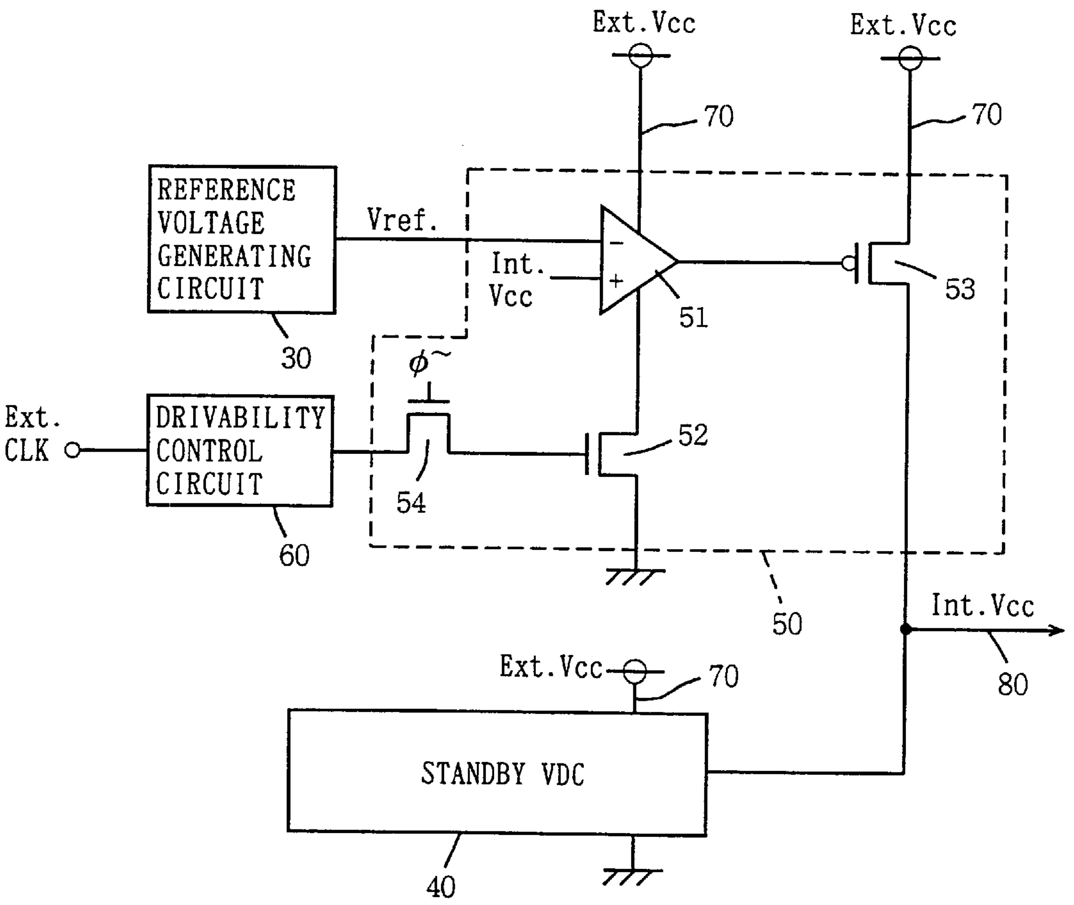
FIG. 3 is a block diagram showing in greater detail the structure of active VDC 50 of FIG. 2.

FIG. 3 is a block diagram showing, in greater detail, the structure of active VDC 50 shown in FIG. 2.

Figure 12:
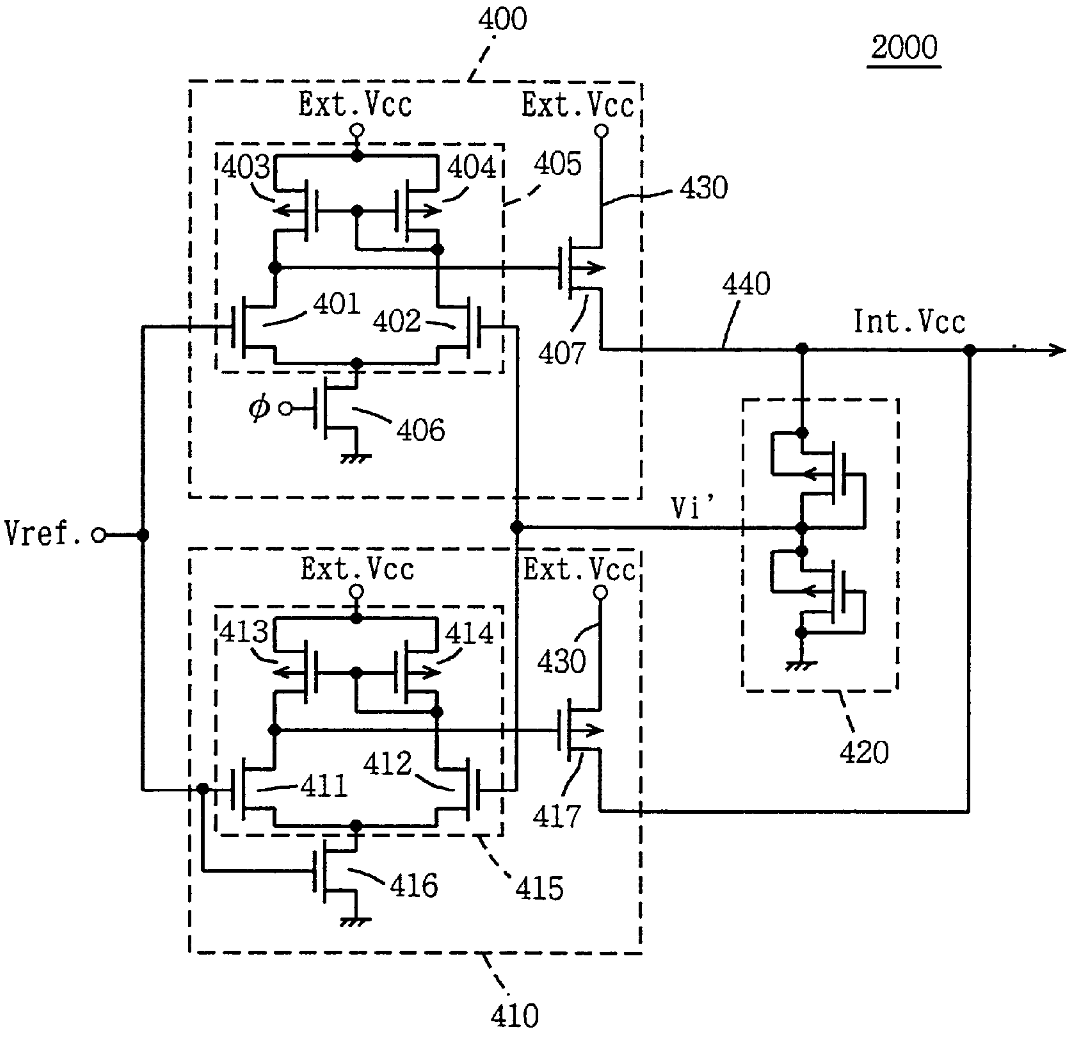
F I G. 1 2 PRIOR ART
FIG. 12 is a circuit diagram showing a structure of a voltage converting circuit 2000 of the prior art including a plurality of voltage lowering units.

Referring to FIG. 3, active VDC 50 will be compared with active VDC 400 shown in FIG. 12. A differential amplifier 51 corresponds to current mirror type differential amplifier 405, and transistors 52 and 53 correspond to current control transistor 406 and driver transistor 407 of active VDC 400, respectively. Operation of these elements is the same as that of active VDC 400. Therefore, description thereof is not repeated.

Active VDC 50 further includes, in addition to the elements of active VDC 400 an operation selecting transistor 54. A drivability control circuit 60 is connected to operation selecting transistor 54.

Operation selecting transistor 54 receives the activating signal $\phi$ at its gate, and operates in a saturation region. More specifically, operation selecting transistor 54 is rendered conductive in the active state, and rendered non-conductive in the standby state.

Drivability control circuit 60 receives the external clock signal and outputs a control signal. The control signal has a DC voltage of which level depends on the operational frequency.

Accordingly, in the active state, the control signal in accordance with the operational frequency is applied to the gate of current driving transistor 52. Here, the control signal is set to have such a level that forces current driving transistor 52 to operate in the linear region.

Therefore, the current supplied by the current driving transistor 52 to differential amplifier 51 is determined dependent on the operational frequency. The larger the supplied current, the faster the speed of response of the differential amplifier 51, and the higher the current drivability of the active VDC 50.

Thus, active VDC 50 which can adjust current drivability in accordance with operational frequency is obtained.

Standby VDC 40 is the same both in structure and operation, as standby VDC 410 described with reference to FIG. 12.

Figure 4:
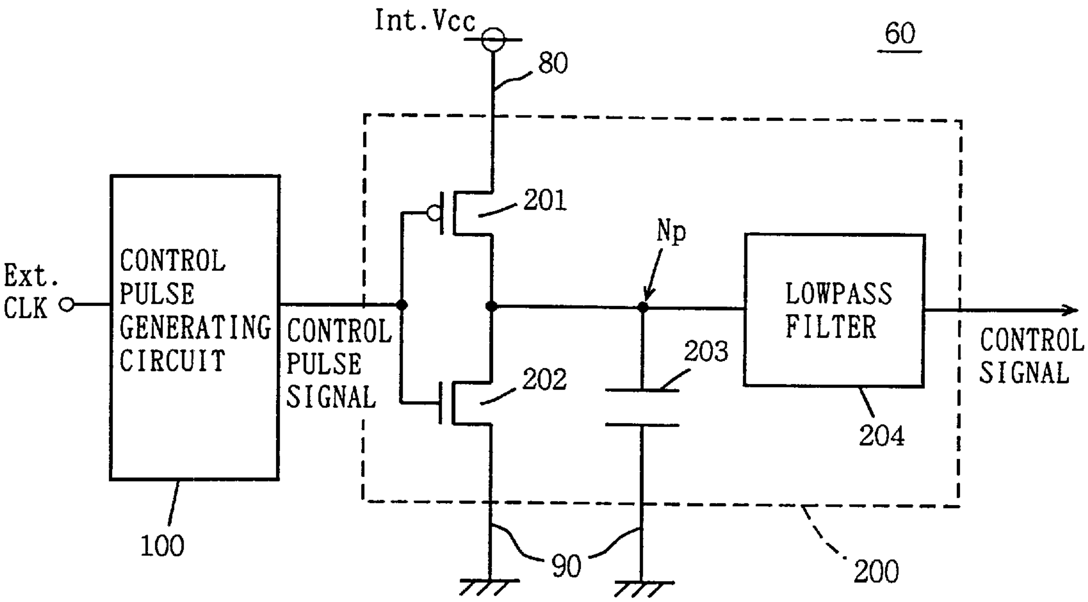
FIG. 4 is a schematic block diagram showing in greater detail the structure of drivability control circuit 60 of FIG. 3.

FIG. 4 is a schematic block diagram showing, in greater detail, the structure of drivability control circuit 60 shown in FIG. 3.

Referring to FIG. 4, drivability control circuit 60 includes a control pulse generating circuit 100 receiving the external clock signal for generating a control pulse signal, and a control signal generating circuit 200 receiving the control pulse for generating a control signal.

Prior to the operation of drivability control circuit 60, the control pulse signal will be described first.

Figure 5:
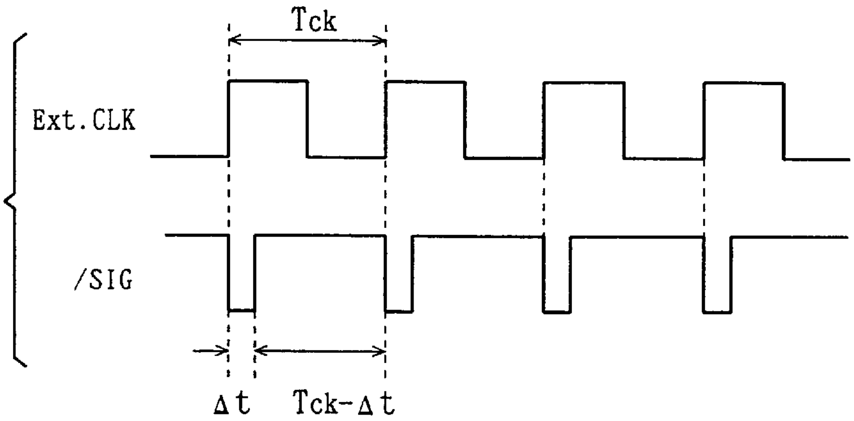
FIG. 5 is a diagram of waveforms illustrating a control pulse signal.

FIG. 5 is a diagram of waveforms illustrating the control pulse signal.

Referring to FIG. 5, external clock (hereinafter referred to as Ext.CLK) is an externally input clock signal.

Ext.CLK corresponds to the operational frequency, and has a period of Tck. The control pulse signal (hereinafter referred to as /SIG signal) is formed based on Ext.CLK.

/SIG signal attains to and kept at "L" level for only a prescribed time period $\Delta t$ at the timing of rise of Ext.CLK, and otherwise kept at "H" level.

Figure 6:
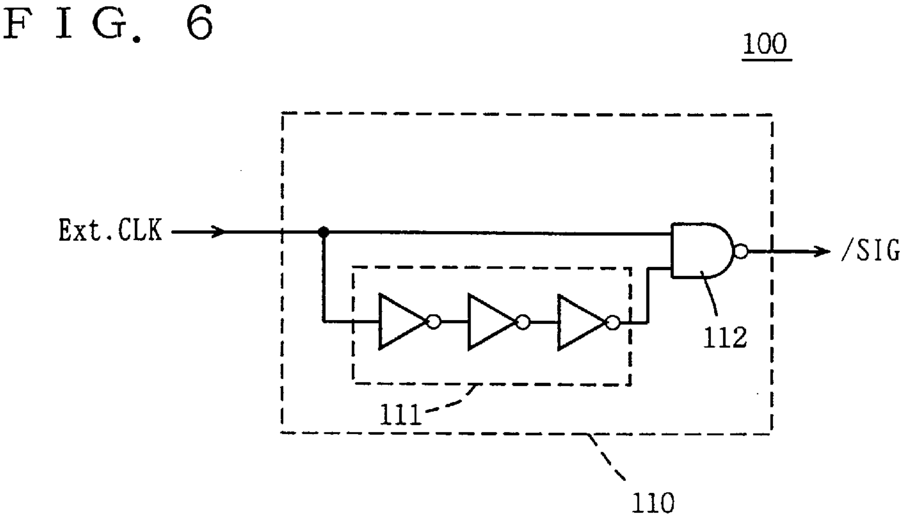
FIG. 6 is a schematic diagram showing an example of a structure of a control pulse generating circuit 100.

FIG. 6 is a specific example of the structure of control pulse generating circuit 100 generating /SIG signal based on Ext.CLK.

Ext.CLK is inverted by an inverter train 111 and delayed by the prescribed time period $\Delta t$. By inputting the signal Ext.CLK inverted and delayed by inverter train 111 together with the original Ext.CLK to an NAND gate 112, /SIG signal described above can be obtained.

The operation of control signal generating circuit 200 will be described.

Again referring to FIG. 4, the control signal generating circuit has a P type transistor 201 having its source coupled to internal power supply line 80, a node Np coupled to the drain of P type transistor 201, and an N type transistor 202 coupled between node Np and a ground line 90.

Control signal generating circuit 200 further has a capacitor 203 connected between node Np and ground potential line 90, and a lowpass filter 204 for smoothing potential Vp at node Np and outputting the control signal.

More specifically, the level of the control signal is determined by the potential Vp at node Np. Namely, the control signal is determined by the amount of charges stored in capacitor 203.

To the gates of P type transistor 201 and N type transistor 202, /SIG signal is applied. P type transistor 201 or N type transistor 202 is rendered conductive in response to the "L" or "H" level of /SIG signal, and capacitor 203 is charged/discharged accordingly. The potential Vp of node Np also changes in accordance with the amount of charges stored in capacitor 203.

Figure 7:
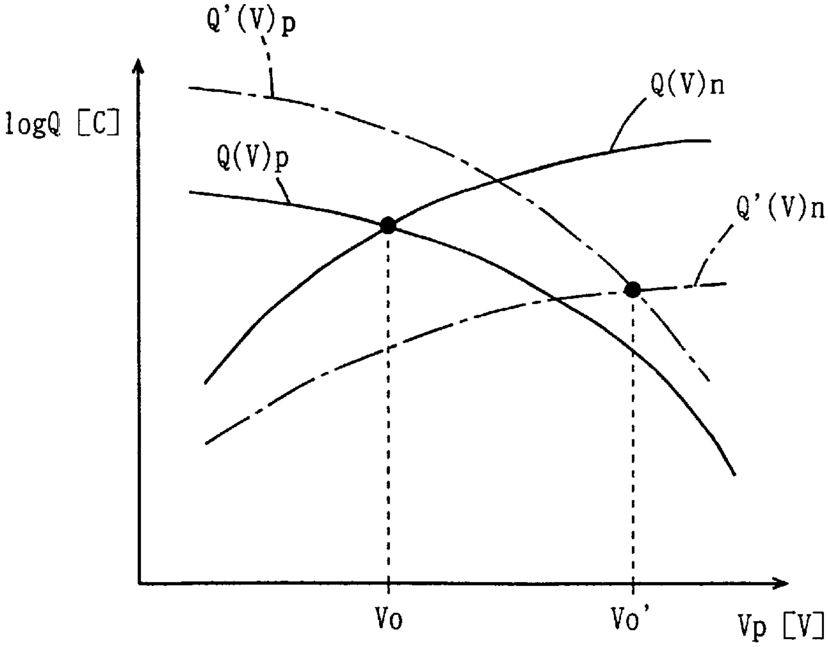
FIG. 7 is an illustration showing relation between potential of node Np and amount of charges for charging/discharging capacitor 203 in FIG. 4.

FIG. 7 is an illustration showing relation between the potential Vp of node Np and the amount of charges charged to or discharged from capacitor 203.

Referring to FIG. 7, Q (V) p represents amount of charges applied through P type transistor 201 to capacitor 203 for charging, and Q (V) n represents amount of charges discharged from capacitor 203 through N type transistor 202.

In the presence of a constant /SIG signal, the amount Q (V) p for charging and amount Q (V) n for discharging match each other and are balanced.

More specifically, the voltage Vp of node Np is balanced at the potential Vo which satisfies the following relation (1), as can be found from the curves of FIG. 7.

$$Q(Vo)p=Q(Vo)n \quad (1)$$

When we represent a current flowing to node Np through P type transistor 201 in the period Δt when /SIG signal at "L" level as ids (V) p, a current flowing to node Np through N type transistor 202 in the period Tck-Δt when /SIG signal is at "H" level as ids (V) n, and the potential of node Np in the balanced state as Vo, from the equation (1), the following relation (2) is satisfied.

$$ids(Vo)p\times\Delta t=ids(Vo)n\times(Tck-\Delta t) \quad (2)$$

The ratio of "L" level period and "H" level period of the signal /SIG is Δt: Tck−Δt. The period Δt in which /SIG signal is "L" level is the same as the delay time generated by the inverter train 111 shown in FIG. 6, and Δt is constant regardless of the period of Ext.CLK.

Therefore, if the period of Ext.CLK is small, that is, if the operational frequency is high, the ratio of "L" level period of the signal /SIG increases.

In this case, the potential Vp of node Np in the balanced state changes in equation (2).

Consider the change in the potential Vp of node Np with the amount of charges for charging from P type transistor 201 being represented as Q' (V) p and the amount of discharge from N type transistor 202 as Q' (V) n with the operational frequency made higher.

Again referring to FIG. 7, the values Q' (V) p and Q' (V) n represented by chain-dotted lines are compared with the values Q (V) p and Q (V) n described above.

As the operational frequency is made higher, the ratio of the time period when P type transistor 201 is conductive increases, and therefore the value Q' (V) p attain higher than Q (V) p. Conversely, the value Q' (V) n is smaller than Q (V) n. Accordingly, the potential Vp of node Np is balanced at a potential Vo', which is higher than Vo. Consequently, the control signal comes to have higher level.

When the operational frequency is made lower, the ratio of the "L" level period of /SIG signal decreases, and therefore the amount of charges for charging capacitor 203 decreases and the amount of discharge increases.

As a result, the potential Vp of node Np is balanced at a lower voltage. Accordingly, the control signal comes to have lower level.

Through the above described operation, drivability control circuit 60 generates the control signal having DC voltage of which level changes in accordance with the operational frequency.

Current driving transistor 52 operating in the linear region supplies a current corresponding to the control signal to differential amplifier 51. Thus current drivability of active VDC 50 is controlled.

In this manner, current drivability of active VDC 50 is increased at the time of high speed operation requiring high response characteristic, while the current drivability is made smaller at a low speed operation not requiring high response characteristic, whereby current consumption is reduced.

More specifically, in semiconductor integrated circuit device 1000 having active VDC 50, appropriate response characteristic is ensured over a wide range of operational frequency without increasing wasteful power consumption and without the necessity of modifying the design of the voltage converting circuit dependent on the system into which the device is incorporated.

Further, even when the device is incorporated in a system of which operational frequency varies, necessary response characteristic can automatically be obtained without fail, while suppressing power consumption.

In control signal generating circuit 200, when the voltage of the power supply line supplying current to capacitor 203 through P type transistor 201 fluctuates, the amount of charges stored in capacitor 203, that is, the potential Vp of node Np fluctuates even in the presence of the same /SIG signal.

Therefore, in order to obtain a control signal having stable level in accordance with the operational frequency, it is necessary to use a power supply less susceptible to voltage fluctuation.

Therefore, in the first embodiment, control signal generating circuit 200 is driven not by the external power supply line but by the internal power supply line.

Second Embodiment

In the first embodiment, /SIG signal is generated from Ext.CLK in control pulse generating circuit 100. In the second embodiment, /SIG signal is generated using a signal obtained by frequency division of Ext.CLk.

Figure 8:
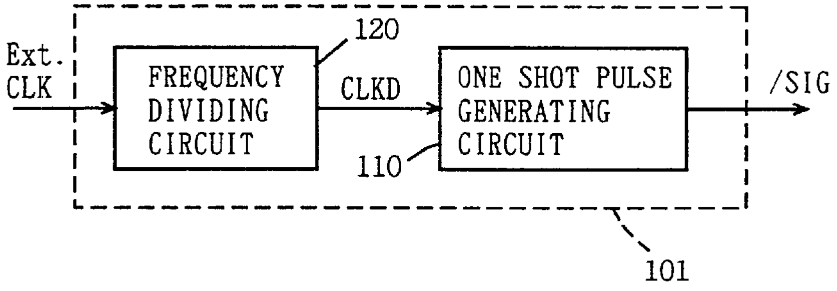
FIG. 8 is a schematic block diagram showing a structure of a control pulse generating circuit 101 in accordance with a second embodiment.

FIG. 8 is a block diagram showing a structure of a control pulse generating circuit 101 in accordance with the second embodiment.

Referring to FIG. 8, control pulse generating circuit 101 includes, in addition to one shot pulse generating circuit 110 having the same structure as control pulse generating circuit 100 of the first embodiment, a frequency dividing circuit 120.

Figure 9:
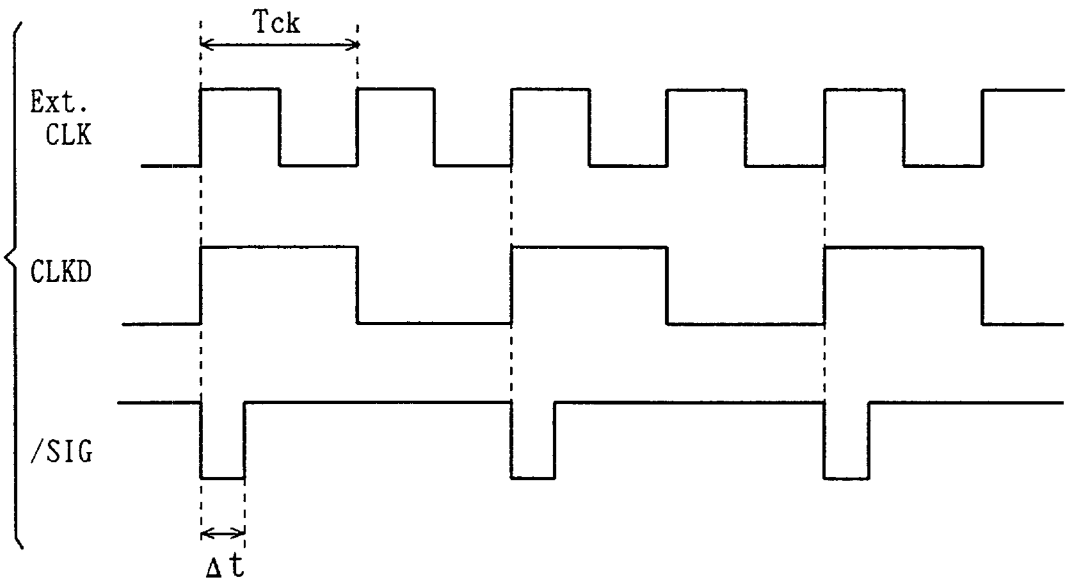
FIG. 9 is a diagram of waveforms related to the operation of control pulse generating circuit 101.

FIG. 9 is a diagram of waveforms illustrating the operation of control pulse generating circuit 101 of FIG. 8.

Referring to FIGS. 8 and 9, frequency dividing circuit 120 receives external clock signal Ext.CLK and provides a signal CLKD with the frequency divided by 2. CLKD is applied to one shot pulse generating circuit 110. Operation of one shot pulse generating circuit 110 is the same as that of control pulse generating circuit 100 shown in FIG. 6, and the signal /SIG which attains and is kept at "L" level only for a prescribed time period Δt at the rise of the pulse of the CLKD signal is generated.

The period Δt of /SIG signal corresponds to the delay time generated by the inverter train 111, and therefore the period Δt is determined dependent on the characteristic value of the transistors constituting inverter train 111.

Therefore, when characteristics of the transistors constituting inverter train 111 fluctuate because of variation in manufacturing process, the period Δt of /SIG also fluctuates as it is affected.

This makes it difficult to accurately control the current drivability in accordance with the operation frequency. The higher the operational frequency, the shorter the pulse interval of /SIG signal, and therefore the greater the influence of fluctuation of the transistor characteristics.

When /SIG signal is formed based on CLKD, which is obtained by frequency-dividing Ext.CLK, wider pulse interval can be secured even if the operational frequency is high.

Consequently, it becomes possible for control pulse generating circuit 101 to provide /SIG signal with the influence of transistor characteristic fluctuation on Δt made smaller.

More specifically, according to the voltage converting circuit having the structure in accordance with the second embodiment, even when operational frequency is high, the control pulse signal can be obtained with the influence of variation of the transistor characteristics constituting inverter train 111 reduced, and therefore, current drivability can be controlled stably over wide range of operational frequency.

By employing a plurality of frequency dividers, it is possible to divide the frequency by 4 or 8.

Third Embodiment

In the first embodiment, control signal generating circuit 200 is driven by internal power supply line 80. In the third embodiment, control signal generating circuit 200 is driven by a VDC provided especially for this circuit.

Figure 10:
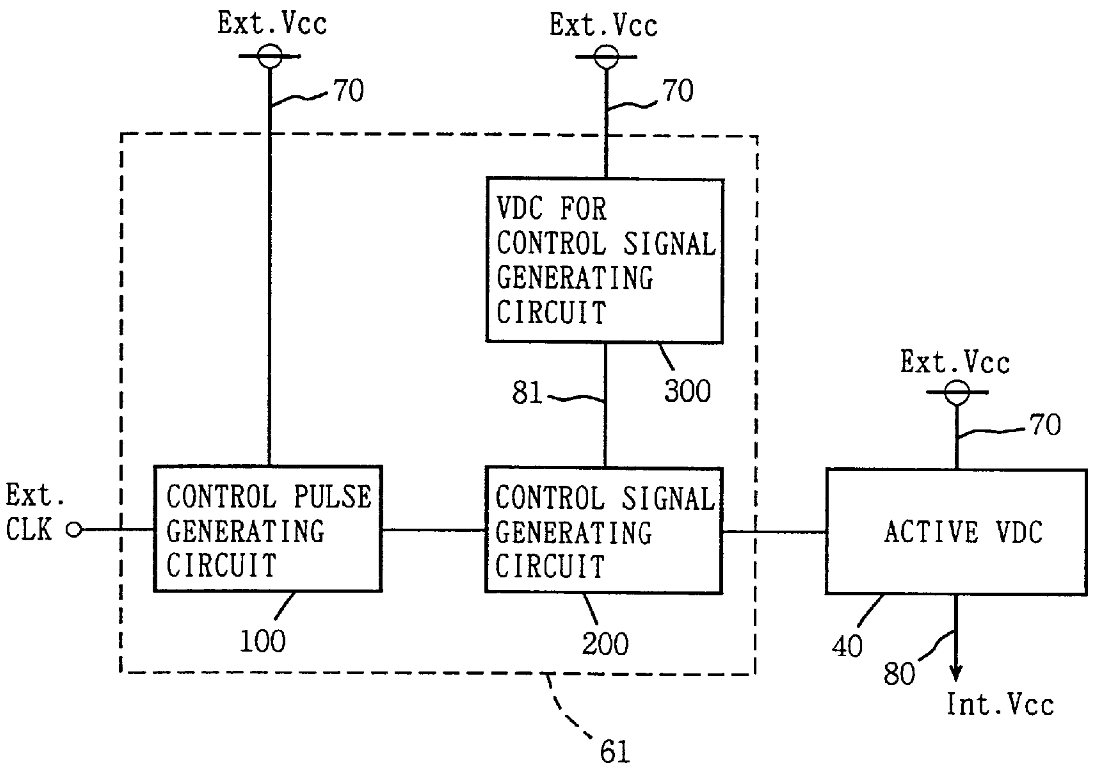
FIG. 10 is a schematic block diagram showing a structure of a drivability control circuit 61 in accordance with a third embodiment.
Figure 11:
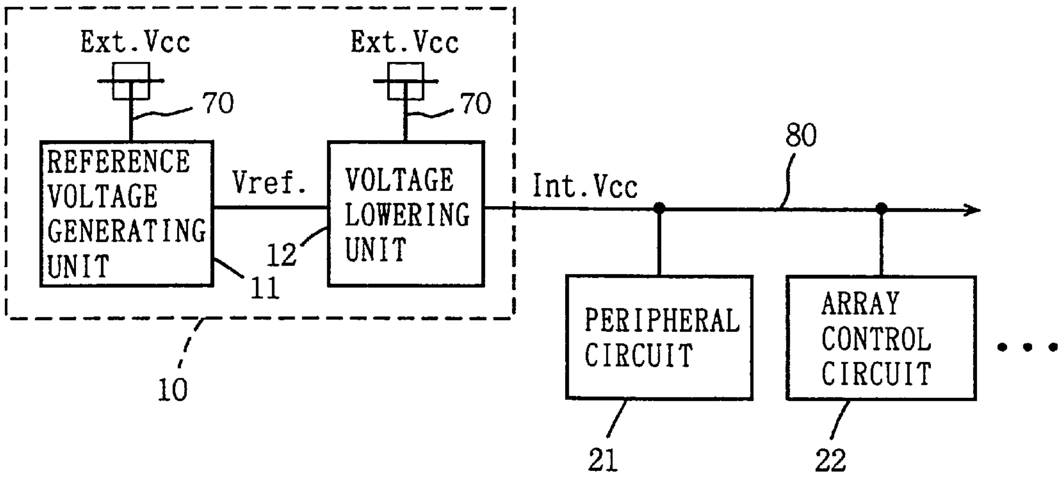
F I G. 1 1 PRIOR ART
FIG. 11 is a schematic block diagram showing a general structure of a conventional voltage converting circuit.

FIG. 10 is a block diagram showing the structure of drivability control circuit 61 in accordance with the third embodiment.

Referring to FIG. 10, drivability control circuit 61 includes, in addition to the structure of drivability control circuit 60 of the first embodiment, a VDC 300 used only for the control signal generating circuit.

Control signal generating circuit 200 is supplied with the power supply voltage from VDC 300 through an internal power supply line 81 used only for this purpose, independent from internal power supply line 80.

As already described, stability of the power supply voltage driving control signal generating circuit 200 has significant influence on stability of the control signal generated by the control signal generating circuit 200. Therefore, by the structure of the third embodiment, even when the voltage Int. Vcc of the internal power supply line 80 has its level made unstable because of the influence of load current consumed in the internal circuitry, a stable control signal can be generated.

More specifically, more accurate feedback is possible with respect to fluctuation of the level of Int. Vcc, and hence a VDC allowing more stable control of the current drivability is obtained.

VDC 300 used only for the control signal generating circuit may be implemented by the conventional structure shown in FIG. 12 or by the structure in accordance with the present invention shown in FIG. 3.

Although the present invention has been described and illustrated in detail, it is clearly understood that the same is by way of illustration and example only and is not to be taken by way of limitation, the spirit and scope of the present invention being limited only by the terms of the appended claim is.

What is claimed is:

1. A semiconductor integrated circuit device, comprising:

an internal circuit which operates supplied with an internal power supply voltage lower than an external power supply voltage, said internal circuit operating at an operational frequency according to an external clock signal;

an external power supply line for transmitting said external power supply voltage;

a first internal power supply line transmitting said internal power supply voltage to said internal circuit;

a first voltage converting circuit supplied with the external power supply voltage supplied from said external power supply line, converting the received external power supply voltage to said internal power supply voltage and supplying said internal power supply voltage to said first internal power supply line, said first voltage converting circuit including:

a reference voltage generating circuit for generating a reference voltage as a reference value for said internal power supply voltage, a first voltage down converting circuit for supplying, when the voltage of said first internal power supply line is lower than said reference voltage, a current with a first current drivability from said external power supply line to said first internal power supply line, a second voltage down converting circuit operating in response to activation of said internal circuit, for supplying, when the voltage of said first internal power supply line is lower than said reference voltage, a current with a second current drivability higher than said first current drivability from said external power supply line to said first internal power supply line, and a drivability control circuit for changing a response speed of said second voltage down converting circuit automatically in accordance with a frequency of said external clock signal.

2. The semiconductor integrated circuit device according to claim 1, wherein said second voltage down converting circuit includes:

a current supply control circuit for amplifying a difference between the voltage of the first internal power supply line and said reference voltage at the speed of response in accordance with said frequency of said external clock signal, and a current supplying circuit connected between said external power supply line and said first internal power supply line, for supplying, when the voltage of said first internal power supply line is lower than said reference voltage, the current from said external power supply line to said first internal power supply line in accordance with an output from said current supply control circuit.

3. The semiconductor integrated circuit device according to claim 2, wherein said drivability control circuit receives said external clock signal and generates a control signal having a DC voltage level, said drivability control circuit changes said DC voltage level continuously in accordance with said frequency of said external clock signal; and said current supply control circuit includes:

a differential amplifying circuit for amplifying said difference between the voltage of the first internal power supply line and said reference voltage, and current control circuit for controlling said speed of response of said current supply control circuit, by supplying a current in accordance with said control signal to said differential amplifying circuit.

4. The semiconductor integrated circuit device according to claim 3, further comprising a second voltage converting circuit receiving said external power supply voltage from said external power supply line and converting the external power supply voltage to a second internal power supply voltage, wherein said drivability control circuit operates supplied with said second internal power supply voltage.

5. The semiconductor integrated circuit device according to claim 1, wherein said drivability control circuit includes:

a control pulse signal generating circuit receiving said external clock signal and outputting a control pulse signal, said control pulse signal generating circuit changing a duty factor of said control pulse signal in accordance with the frequency of said external clock signal, and a control signal generating circuit generating a control signal having a DC voltage component, said control signal generating circuit changing said DC voltage level continuously in accordance with said duty factor of said control pulse signal, and said second voltage down converting circuit includes:

a current supply control circuit for amplifying a difference between the voltage of the first internal power supply line and said reference voltage at a speed of response in accordance with said DC voltage level of said control signal, and a current supplying circuit connected between said external power supply line and said first internal power supply line, for supplying the current from said external power supply line to said first internal power supply line in accordance with an output from said current supply control circuit.

6. The semiconductor integrated circuit device according to claim 5, wherein said control signal generating circuit operates supplied with said internal power supply voltage.

7. The semiconductor integrated circuit device according to claim 5, further comprising a second voltage converting circuit receiving said external power supply voltage from said external power supply line and converting the external power supply voltage to a second internal power supply voltage, wherein said control signal generating circuit operates supplied with said second internal power supply voltage.

8. A semiconductor integrated circuit device, comprising:

(a) an internal circuit which operates supplied with an internal power supply voltage lower than an external power supply voltage;

(b) an external power supply line for transmitting said external power supply voltage;

(c) a first internal power supply line transmitting said internal power supply voltage to said internal circuit;

(d) a first voltage converting circuit supplied with the external power supply voltage supplied from said external power supply line, converting the received external power supply voltage to said internal power supply voltage and supplying said internal power supply voltage to said first internal power supply line, said first voltage converting circuit including:

(d-1) a reference voltage generating circuit for generating a reference voltage as a reference value for said internal power supply voltage, (d-2) a first voltage down converting circuit for supplying, when the voltage of said first internal power supply line is lower than said reference voltage, a current with a first current drivability from said external power supply line to said first internal power supply line, (d-3) a second voltage down converting circuit operating in response to activation of said internal circuit, for supplying, when the voltage of said first internal power supply line is lower than said reference voltage, a current with a second current drivability higher than said first current drivability from said external power supply line to said first internal power supply line, said second voltage down converting circuit including:

(d-3-1) a current supply control circuit for amplifying a difference between the voltage of the first internal power supply line and said reference voltage at a speed of response in accordance with an operational frequency of said semiconductor integrated circuit device, said current supply control circuit including (d-3-1-1) a differential amplifying circuit for amplifying said difference between the voltages, and (d-3-1-2) a current control circuit for controlling said speed of response of said current supply control circuit, by supplying the current in accordance with a control signal to said differential amplifying circuit, and (d-3-2) a current supplying circuit connected between said external power supply line and said first internal power supply line, for supplying, when the voltage of said first internal power supply line is lower than said reference voltage, a current from said external power supply line to said first internal power supply line in accordance with an output from said current supply control circuit, and (d-4) a drivability control circuit for controlling said second drivability in accordance with said operational frequency, said drivability control circuit generating said control signal having a DC voltage component corresponding to said operational frequency, said drivability control circuit including:

(d-4-1) a control pulse signal generating circuit receiving an external clock signal having a period corresponding to said operational frequency for outputting a control pulse signal which is a binary signal having a periodic state activated upon activation of said external clock signal, said periodic state having a prescribed pulse width shorter than the period of said external clock signal, and (d-4-2) a control signal generating circuit receiving said control pulse signal for generating said control signal, said control signal generating circuit including:

(d-4-2-1) a first ground line corresponding to said first internal power supply line, (d-4-2-2) an internal node, (d-4-2-3) a capacitor coupled between said internal node and said first ground line, (d-4-2-4) a lowpass filter for smoothing voltage of the internal node to output said control signal, (d-4-2-5) a charging circuit for charging, when said binary signal is at one state, said internal node from said first internal power supply line, and (d-4-2-6) a discharging circuit for discharging, when said binary signal is at the other state, said internal node to said first ground line.

9. The semiconductor integrated circuit device according to claim 8, wherein said charging circuit has an MOS transistor of a first conductivity type having its source coupled to said first internal power supply line and receiving at its gate said control pulse signal;

said discharging circuit has an MOS transistor of a second conductivity type coupled between said internal node and said first ground line, and receiving at its gate said control pulse signal; and said internal node is coupled to said first internal power supply line through said MOS transistor of the first conductivity type.

10. The semiconductor integrated circuit device according to claim 8, wherein said control pulse signal generating circuit has a frequency dividing circuit for dividing a frequency of said external clock signal, and generates said control pulse signal based on a frequency of a signal obtained by said frequency dividing circuit.

11. A semiconductor integrated circuit device, comprising:

a) an internal circuit which operates supplied with an internal power supply voltage lower than an external power supply voltage;

b) an external power supply line for transmitting said external power supply voltage;

c) a first internal power supply line transmitting said internal power supply voltage to said internal circuit;

d) a first voltage converting circuit supplied with the external power supply voltage supplied from said external power supply line, converting the received external power supply voltage to said internal power supply voltage and supplying said internal power supply voltage to said first internal power supply line, said first voltage converting circuit including:

(d-1) a reference voltage generating circuit for generating a reference voltage as a reference value for said internal power supply voltage, (d-2) a first voltage down converting circuit for supplying, when the voltage of said first internal power supply line is lower than said reference voltage, a current with a first current drivability from said external power supply line to said first internal power supply line, (d-3) a second voltage down converting circuit operating in response to activation of said internal circuit, for supplying, when the voltage of said first internal power supply line is lower than said reference voltage, a current with a second current drivability higher than said first current drivability from said external power supply line to said first internal power supply line, said second voltage down converting circuit including:

(d-3-1) a current supply control circuit for amplifying a difference between the voltage of the first internal power supply line and said reference voltage at a speed of response in accordance with an operational frequency of said semiconductor intergrated circuit device, said current supply control circuit including:

(d-3-1-1) a differential amplifying circuit for amplifying said difference between the voltage of the first internal power supply line and said reference voltage, and (d-3-1-2) a current control circuit for controlling said speed of response to said current supply control circuit, by supplying a current in accordance with a control signal to said differential amplifying circuit, and (d-3-2) a current supplying circuit connected between said external power supply line and said first internal power supply line, for supplying, when the voltage of said first internal power supply line is lower than said reference voltage, the current from said external power supply line to said first internal power supply line in accordance with an output from said current supply control circuit, (d-4) a drivability control circuit for controlling said second drivability in accordance with said operational frequency of said semiconductor integrated circuit device, said drivability control circuit generating said control signal having a DC voltage component corresponding to said operational frequency, (e) a second voltage converting circuit receiving said external power supply voltage from said external power supply line and converting the external power supply voltage to a second internal power supply voltage; and (f) a second internal power supply line transmitting said second internal power supply voltage from said second voltage converting circuit, wherein said drivability control circuit includes:

(d-4-1) a control pulse signal generating circuit receiving an external clock signal having a period corresponding to said operational frequency for outputting a control pulse signal which is a binary signal having a periodic state activated upon activation of said external clock signal, said periodic state having a prescribed pulse width shorter than the period of said external clock signal, and (d-4-2) a control signal generating circuit receiving said control pulse signal for generating said control signal; and said control signal generating circuit including:

(d-4-2-1) a first ground line corresponding to said first internal power supply line, (d-4-2-2) an internal node, (d-4-2-3) a capacitor coupled between said internal node and said first ground line, (d-4-2-4) a lowpass filter for smoothing a voltage of the internal node to output said control signal, (d-4-2-5) a charging circuit for charging, when said binary signal is at one state, said internal node from said second internal power supply line, and (d-4-2-6) a discharging circuit for discharging, when said binary signal is at the other state, said internal node to said first ground line.

12. The semiconductor integrated circuit device according to claim 11, wherein said charging circuit has an MOS transistor of a first conductivity type having its source coupled to said second internal power supply line and receiving at its gate said control pulse signal;

said discharging circuit has an MOS transistor of a second conductivity type coupled between said internal node and said first ground line and receiving at its gate said control pulse signal; and said internal node is coupled to said second internal power supply line through the MOS transistor of the first conductivity type.

13. The semiconductor integrated circuit device according to claim 11, wherein said control pulse signal generating circuit has a frequency dividing circuit for dividing a frequency of said external clock signal, and generates said control pulse signal based on a frequency of a signal obtained by said frequency dividing circuit.

14. A semiconductor integrated circuit device, comprising:

an internal circuit which operates supplied with an internal power supply voltage lower than an external power supply voltage, said internal circuit operating at an operational frequency according to an external clock signal;

an external power supply line for transmitting said external power supply voltage;

a first internal power supply line transmitting said internal power supply voltage to said internal circuit; and a first voltage converting circuit supplied with the external power supply voltage supplied from said external power supply line, converting the received external power supply voltage to said internal power supply voltage and supplying said internal power supply voltage to said first internal power supply line, said first voltage converting circuit including:

a first voltage down converting circuit for supplying, when the voltage of said first internal power supply line is lower than a reference voltage that is a reference value for said internal power supply voltage, a current with a first current drivability from said external power supply line to said first internal power supply line, a second voltage down converting circuit operating in response to activation of said internal circuit, for supplying, when the voltage of said first internal power supply line is lower than said reference voltage, a current with a second current drivability higher than said first current drivability from said external power supply line to said first internal power supply line, and a drivability control circuit for changing a response speed of said second voltage down converting circuit automatically in accordance with a frequency of said external clock signal.

15. A semiconductor integrated circuit device, comprising:

an internal circuit which operates supplied with an internal power supply voltage lower than an external power supply voltage, said internal circuit operating at an operational frequency according to an external clock signal;

an external power supply line for transmitting said external power supply voltage;

a first internal power supply line transmitting said internal power supply voltage to said internal circuit; and a first voltage converting circuit supplied with the external power supply voltage supplied from said external power supply line, converting the received external power supply voltage to said internal power supply voltage and supplying said internal power supply voltage to said first internal power supply line, said first voltage converting circuit including:

a reference voltage generating circuit for generating a reference voltage as a reference value for said internal power supply voltage;

a drivability control circuit for generating a control signal having a DC voltage level varying continuously in accordance with a frequency of said external clock signal; and a voltage down converting circuit for supplying, when the voltage of said first internal power supply line is lower than said reference voltage, a current with a first current drivability from said external power supply line to said first internal power supply line, and for supplying, in response to activation of said internal circuit, when the voltage of said first internal power supply line is lower than said reference voltage, a current with a second current drivability higher than said first current drivability from said external power supply line to said first internal power supply line, wherein said second current drivability is varied in accordance with said DC voltage level of the control signal.

16. A semiconductor integrated circuit device, comprising:

an internal circuit which operates supplied with an internal power supply voltage lower than an external power supply voltage, said internal circuit operating at an operational frequency according to an external clock signal;

an external power supply line for transmitting said external power supply voltage;

a first internal power supply line transmitting said internal power supply voltage to said internal circuit; and a first voltage converting circuit supplied with the external power supply voltage supplied from said external power supply line, converting the received external power supply voltage to said internal power supply voltage and supplying said internal power supply voltage to said first internal power supply line, said first voltage converting circuit including:

a drivability control circuit for generating a control signal having a DC voltage level varying continuously in accordance with a frequency of said external clock signal; and a voltage down converting circuit for supplying, when the voltage of said first internal power supply line is lower than a reference voltage that is a reference value for said internal power supply voltage, a current with a first current drivability from said external power supply line to said first internal power supply line, and for supplying, in response to activation of said internal circuit, when the voltage of said first internal power supply line is lower than said reference voltage, a current with a second current drivability higher than said first current drivability from said external power supply line to said first internal power supply line, wherein said second current drivability is varied in accordance with said DC voltage level of the control signal.

* * * * *